United States Patent [19]
Cathey et al.

[11] Patent Number: 5,223,083
[45] Date of Patent: Jun. 29, 1993

[54] PROCESS FOR ETCHING A SEMICONDUCTOR DEVICE USING AN IMPROVED PROTECTIVE ETCHING MASK

[75] Inventors: David A. Cathey; J. Brett Rolfson, both of Boise, Id.

[73] Assignee: Micron Technology, Inc., Boise, Id.

[21] Appl. No.: 824,792

[22] Filed: Jan. 23, 1992

[51] Int. Cl.$^5$ .................... H01L 21/306; B44C 1/22
[52] U.S. Cl. .................... 156/643; 156/657; 156/659.1; 156/662; 156/904; 437/229; 437/233
[58] Field of Search ............ 156/643, 646, 657, 659.1, 156/662, 904; 204/192.37; 437/233, 229

[56] References Cited

U.S. PATENT DOCUMENTS

| | | | |
|---|---|---|---|
| 4,174,217 | 11/1979 | Flatley | 437/229 |
| 4,789,646 | 12/1988 | Davis | 156/662 |
| 4,826,754 | 5/1989 | Bobbio | 437/229 |

OTHER PUBLICATIONS

S. Wolfe and R. N. Tauber (1987), "Silicon Processing for the VLSI ERA", vol. 1—Process Technology, pp. 420 and 421.

*Primary Examiner*—William A. Powell
*Attorney, Agent, or Firm*—Angus C. Fox, III

[57] ABSTRACT

The subject process relates to the etching of a semiconductor device having a re-entrant profile area which causes residual positive photoresist material to remain therewithin after formation of an etch mask of the positive photoresist material. A negative photoresist etch mask is formed on a major surface of the outer conductive film structural layer. The etch mask comprises a plurality of photoresist lines arranged in a predetermined pattern which defines a plurality of spaces therebetween, which in turn expose a plurality of areas of the major surface of the semiconductor device. Substantially all of the negative photosensitive material located within the re-entrant profile area is removed during the etch mask formation process. The exposed areas of the major surface of the outer structural layer can then be etched to form the requisite etch pattern with a chemical etchant system without regard to interference by unwanted residual photoresist material.

22 Claims, 1 Drawing Sheet

PROCESS FOR ETCHING A SEMICONDUCTOR DEVICE USING AN IMPROVED PROTECTIVE ETCHING MASK

BACKGROUND OF THE INVENTION

This invention relates to an improved process for selectively etching semiconductor devices, and more particularly to a process for effectively and efficiently etching multi-layer semiconductor devices using an improved resist etching mask.

It is known in the prior art that the manufacture of multi-layer semiconductor devices, such as in the fabrication of very large scale integration (VLSI) semiconductor chips including stacked capacitor Dram memory chips, can be produced by patterned etching using liquid or wet etching materials of certain layers of these devices. Etching can also be conducted in a gas phase using known techniques such as plasma etching, ion beam etching, and reactive ion etching.

In the etching process of semiconductor devices, a protective etching mask is first formed employing a layer of photoresist material ("resist") disposed on a major surface of the semiconductor device. This protective resist etch mask is designed to facilitate the formation of a desired pattern of lines and spaces in the resist layer based on a predetermined etch pattern in the resist layer. Thus, when an optical source, such as UV light, contacts these predetermined resist areas, a pattern is created in the resist structure which exposes the requisite portions of the semiconductor surface for subsequent etching purposes. The higher the number of narrow lines, and the narrower the spaces therebetween, i.e., widths of three microns or less, the more the capacitance per unit area which can be stored on a given semiconductor device, and the higher the resolution of that device. Once the protective etching resist mask are in place on the semiconductor surface, etching of the exposed areas can commence to produce a semiconductor having a predetermined etched pattern.

One of the first resist materials used in semiconductor fabrication produced a negative image and thus was called negative resist. As shown in FIG. 1, areas where the optical source strikes becomes polymerized and more difficult to remove. When the resist is "developed" (subjected to a solvent), polymerized regions remain and the unpolymerized areas are removed. These negative resists have three components. First is the resin portion which is radiation insensitive but is extremely soluble in non-polar organic solvents. Polyvinyl cinnamate was used as the basic resin in most of the resists of the 1960's. However, most of these negative resist resins today are based on cyclized polyisoprene polymers. The second component is the sensitizer which is a photoactive compound. A photochemical reaction is initiated which generates a cross-linked three-dimensional molecular network that is insoluble in a developer material. The most important photoreaction is the evolution of nitrogen from the excited state of the arylazide to form an extremely reactive intermediate compound called a nitrene. A wide range of sensitizers may be used, including quinones, azido compounds, and nitro compounds for polyvinyl cinnamate and azides for cyclized polyisoprene. A small quantity of novolak resin can be added to improve adhesion during developing. The third component is the developer. Developers include nitrobenzene and furfural for poly-vinyl cinnamate, and xylene and benzene for polyisoprene.

Historically, negative resists have been unsuitable for applications requiring line and space dimensions of the resist pattern which are less than 3 microns, see "Silicon Processing For The VLSI ERA", Volume 1-Process Technology, S. Wolf and R. N. Tauber (1987). The major problem is swelling. Regardless of the resin or additives, negative resists are known to suffer from swelling problems during development. Even though the developer doesn't dissolve the exposed resist, it is absorbed therein and causes swelling. During subsequent rinse operations, the developer is removed, and the resist shrinks. If the resist lines are closer together than 3 microns (as required for high resolution), the swelling can cause them to touch. During the subsequent shrinkage process, they may remain stuck together thereby eliminating the required spacing between lines. Long and narrow resist lines can also become wavy during swelling and, if surface adherence is good, will retain their waviness after shrinkage. Furthermore, the resist lines can be pulled loose from the substrate.

Because the above problems with negative resists, positive resists replaced the negative resist materials. Positive resists are based on a totally different chemistry than negative resists. As shown in FIG. 2, exposure to an optical source changes the positive resist material so that it is solubilized and can be more easily removed. Since the exposed regions are removed, the resist is referred to as positive. Positive resists function very differently from negative resists. The sensitizer and the resin do not interact, so the change in solubility is all due to the sensitizer. The sensitizer breaks down under the influence of an optical source and increases the solubility rate in alkaline solutions by a factor of about a thousand. Since the presence of the sensitizer inhibits dissolution, it is often referred to as an inhibitor. While negative resists use only 2% or 3% sensitizer, in positive resists 20% may be used. The most common sensitizer is naphthoquinone diazide. Ethylene glycol monomethyl can be employed as a solvent, while diluents may include butyl and cellusolve acetate. Positive resists have a broader optical sensitivity than negative resists and can utilize the output of a more of a conventional UV lamp. By exposing the resist to the desired optical pattern in a vacuum and then flood-exposing the entire surface with UV, the previously unexposed resist becomes soluble and that exposed in vacuum remains insoluble. In this way, a positive resist can produce a resist pattern with lines and spaces having a three micron or less dimension without the swelling problems associated with negative resists.

Sequential layering processes employed in the fabrication of stacked capacitor Dram memory chips and other VSLI semiconductor chips can result in situations where conductive films are needed to be deposited on surfaces with "re-entrant" profiles which have an irregular configuration. For instance, as seen in FIGS. 1 and 2, in the formation of TEOS oxide-polysilicon semiconductor devices 10, the outer portion of the outer surface of a topographic layer 12, typically silicon dioxide, is formed in a "winged" configuration. This winged configuration forms recesses or "caves" 14. A conductive layer 15, generally polysilicon, is formed on the outer surface of the topographical layer 12. Photolithographic patterning and etching is conducted on this device having a winged configuration. When a conventional positive resist material 16 is employed, such as a novolak resin resist in combination with oxygen plasmas or aggressive developers, residual resist material 16' is "trapped" in the caves 14 because the resist material is not exposed to UV light (see FIG. 2). The is because the UV light, denoted by arrows "20" in FIG. 1, is unable to penetrate into the caves. In turn, the conductive layer 15 located within the confines of the caves 14 is not subsequently removed during the etching process. Thus, the etching process becomes inhibited by underexposed and/or underdeveloped residual resist on sidewalls of the re-entrant profiles and out-of-focus deep troughs resulting in conductive shorts remaining after etching. Even after UV-exposure and developing residual resist material 16', typically in the form of a resist stringer, remains in the caves. An ancillary etching procedure must then be performed in which a basic pH develop or an oxygen-containing plasma is employed to remove the residual resist material and conductive layer. This results in a undesirable CD loss.

Therefore, a need exists for a process for etching semiconductor devices which can produce resist patterns having line and space dimensions which are less than 3 microns, which in turn produce semiconductor devices having high resolution etched patterns, without the formation of residual resist material and without requiring a subsequent residual resist removal process.

SUMMARY OF THE INVENTION

The process of the present invention meets the above-described existing needs in etching semiconductors by producing resist patterns having line and space dimensions which are less than 3 microns, which in turn produce semiconductor devices having high resolution etched patterns. This is accomplished without the formation of residual resist material, and without requiring a subsequent residual resist removal process prior to etching of desired patterns in the semiconductors.

The subject invention is directed to a process for etching a semiconductor device to form a predetermined etched pattern therein. In the process of this invention a semiconductor device is provided having a plurality of structural layers. The structural layers of the semiconductor device are formed on an underlying silicon structural substrate. Next, an etch mask is formed on a major surface of the semiconductor device 10. The etch mask is produced by coating a layer of negative photoresist material 18 onto a major surface of the outer structural layer of the semiconductor device (see FIG. 3). The etch mask comprises a plurality of photoresist lines arranged in a predetermined pattern, formed as hereinafter described, which defines a plurality of spaces therebetween. The plurality of spaces result from chemically developing the areas of the negative photoresist in which a pattern has not be formed. In this way, the negative resist material located in the cave areas 14 are removed by the chemical developing agents during the resist removal process so that substantially no residual resist material is remaining. The plurality of spaces in the etch mask uncover a plurality of areas of the major surface of the semiconductor device, typically conductive layer 15. In these areas the photoresist lines and spaces therebetween have width dimensions of less than 3 microns, preferably up to 2 microns, more preferably up to 1 micron, and most preferably not more than 0.5 microns. The plurality of exposed areas of the major surface of the outer structural layer are then selectively etched with a chemical etchant system. An etched pattern is then formed in the outer structural layer which produces semiconductor devices having high resolution etched patterns, without leaving substantial undesirable stringers or other unwanted patterns that could occur by using positive resist (see FIG. 4).

The process of the present invention for forming a negative photoresist etch mask on a major surface of the outer semiconductor device can further comprise coating the major surface of the semiconductor device with a layer of a negative photosensitive resin. The negative photosensitive resin is then exposed to an optical image comprising a plurality of photoresist lines arranged in a predetermined pattern which defines a plurality of spaces therebetween. The exposed negative photosensitive resin then produces an in situ catalyst at any sites contacted by the optical image. The exposed negative photosensitive resin is then crosslinked at the sites contacted by the optical image in the predetermined pattern. Finally, the crosslinked polymerized negative photosensitive resin is developed with a photodeveloping agent to remove the non-crosslinked polymerized negative photosensitive resin and thereby forming said negative photoresist etch mask. Although most high-resolution negative-type photoresists can be employed for this purpose, the negative photosensitive resin typically comprises an acid-catalyzed photosensitive resin, and the photodeveloping agent is typically a dilute hydroxide solution. Preferably, the dilute hydroxide solution is dilute tetramethyl ammonium hydroxide, the negative photosensitive resin comprises a poly p-vinyl phenol resin and an acid-activated crosslinking agent. The photoacid generator releases an acid upon exposure to UV light which causes crosslinking to occur in the film. As for the preferred formulation, the acid-catalyzed photosensitive resin comprises poly p-vinyl phenol resin, an acid-activated crosslinking agent, and a photoacid generator.

The subject process also relates to the etching of a semiconductor device having a re-entrant profile area which causes residual positive photoresist material to remain therewithin after formation of an etch mask of the positive photoresist material. As previously discussed, a negative photoresist etch mask is formed on a major surface of the outer conductive film structural layer. The etch mask comprises a plurality of photoresist lines arranged in a predetermined pattern which defines a plurality of spaces therebetween, which in turn expose a plurality of areas of the major surface of the semiconductor device. This negative photoresist etch mask formation comprises coating the major surface of the semiconductor device with a layer of a negative photosensitive resin and exposing said negative photosensitive resin to an optical image comprising a plurality of photoresist lines arranged in a predetermined pattern which defines a plurality of spaces therebetween. The exposed negative photosensitive resin is crosslinked at the sites contacted by the optical image. In producing the negative photoresist etch mask, the crosslinked polymerized negative photosensitive resin is developed with a photodeveloping agent to remove the non-crosslinked polymerized negative photosensitive resin. Substantially all of the negative photosensitive material located within the re-entrant profile area is also removed. The exposed areas of the major surface of the outer structural layer can then be etched to form the requisite etch pattern with a chemical etchant system without regard to interference by unwanted residual photoresist material.

The above semiconductor devices generally comprise VSLI semiconductor devices such as a stacked capacitor Dram memory device.

DETAILED DESCRIPTION OF A PREFERRED EMBODIMENT

Figure 1:
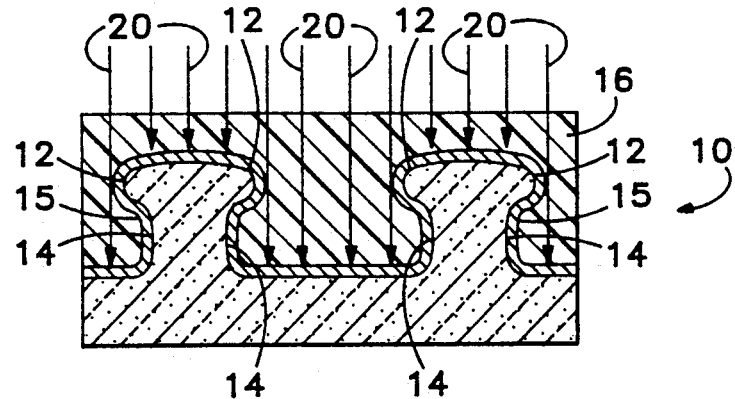
FIG. 1 is a pictorial cross-sectional representation for removing a predetermined pattern of a prior art positive resist material which coats a semiconductor device having a re-entrant profile as part of a chemical etching process.
Figure 2:
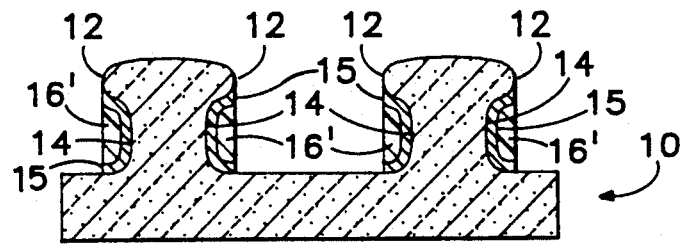
FIG. 2 is a pictorial cross-sectional representation of the results of the positive resist removal process of FIG. 1 in which a residual portion of the resist material remains.
Figure 3:
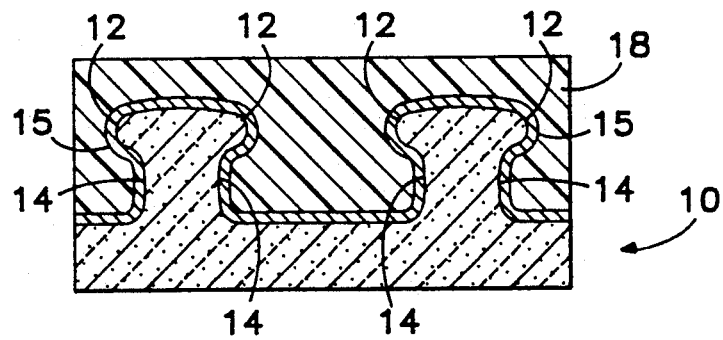
FIG. 3 is a pictorial cross-sectional representation of an etching process of the present invention in which a negative resist material coats a semiconductor device having a re-entrant profile as part of a chemical etching process.
Figure 4:
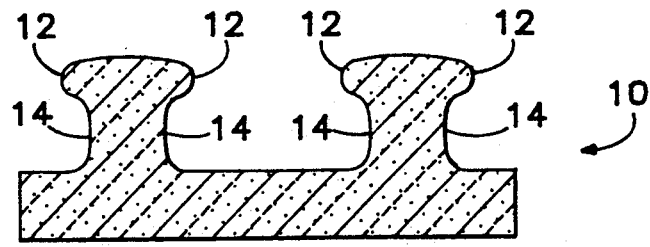
FIG. 4 is a pictorial cross-sectional representation of the results of the removing a predetermined portion of the negative resist material of FIG. 3 in which no residual portion of the resist material remains.

The inventive process herein is directed to selectively etching a semiconductor device in the manner pictorially described in FIG. 3.

Here are illustrative examples of conventional methods of solving the problems associated with the use of positive photoresist materials in the fabrication of semiconductor devices having re-entrant profiles, such as stacked-cell capacitors. These problems include the formation of stringers and the like. In one prior art method, a second photomasking step using positive photoresist is conducted to open the area where stringers may be formed. For example, an anisotropic etch can be used to define the capacitor plate in order to maximize its area. Then, the positive photoresist would be stripped and the semiconductor device would be recoated. A "stringer mask" would be imparted to the device. Then, a very aggressive, isotropic etch would remove the stringers from the re-entrant areas in which they are located. Although this method maximizes cell size, it requires much more processing and therefore a much higher cost of fabrication. In the other illustrative prior art method, the entire pattern is aggressively isotropically etched. The drawback of this method is that is greatly reduces the cell size, the device performance and shrinkability.

The prior art methods have been conducted and have been found to be unacceptable, particularly from a "shrinkability" point standpoint, the maximum cell size must be maintained. In a Dram, the amount of charge each cell can hold directly impacts the performance of the entire device. Anytime the cell can be made larger, performance will be improved. Furthermore, if the cell size is limited, it will be more difficult to shrink. Shrinkability is very important because it allows more candidates to be formed in a given area.

Here is an illustrative example of the process of the present invention which employs a negative photoresist process. Using a similar semiconductor device having a re-entrant profile, a coating step can be conducted in which the device is coated with an acid-catalyzed, photosensitive resin, such as Shipley XP-91101 resin manufactured by the Shipley Company. The process can be performed using a spin technique employing a Series 8800 Coat Track, manufactured by the Silicon Valley Group. The resin is first applied to the surface of the semiconductor device and is spun for approximately 30 seconds at 2500–5000 rpm to make the coating more uniform. The device should then be baked on a vacuum heated hotplate for 40 to 120 seconds at temperature of from 85 to 115 degrees C. The resin on the coated device is then exposed to the desired etch pattern using an optical imaging tool, such as a 2500/40 i-line stepper machine manufactured by ASM-Lithography. A post-exposure bake step is then performed on the exposed coated device on a vacuum hotplate for between 40 to 120 seconds at a temperature of 95 to 125 degrees C. After the post-exposure heat step, a pattern development step should be conducted using a dilute solution of tetramethyl ammonium hydroxide (0.125–0.275N). This can either be done by immersion of the workpiece for between 20 to 45 seconds followed by a water rinse and a drying step, or by a single- or double-puddle develop on a spinner apparatus, the first puddle being from 7–15 seconds followed by a water rinse with the wafer spinning from 200–1500 rpm for 5–20 seconds, then a second puddle lasting between 10–25 seconds. The requisite etching process is then carried on as described below in the usual semiconductor formation process.

A preferred manner of etching of the respective structural layers is by plasma etch. The gas plasma etch technique employed herein typically take place in an etching area in a gas plasma generated under vacuum within the confines of an RF discharge unit. The preferred plasma etch technique employed herein may include the use of ECR, electro cyclotron resonance, RIE, MIE, PE reactive ion, point plasma etching, magnetically confined PE, or magnetron PE.

Having illustrated and described this invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A process for etching a semiconductor device to form a predetermined etched pattern therein, comprising:

providing a semiconductor device having a plurality of structural layers, the structural layers of the semiconductor device being formed on an underlying silicon structural substrate;

forming a negative photoresist etch mask on a major surface of an outer structural layer, without substantial residual resist material remaining in areas that should be free of resist material and which would act as an impediment to the etching process, said resist mask comprising a plurality of photoresist lines arranged in a predetermined pattern which defines a plurality of spaces therebetween, said plurality of spaces exposing a plurality of areas of the major surface of the semiconductor device, and said photoresist lines and spaces therebetween have width dimensions of less than 3 microns; and selectively etching the plurality of exposed areas of the major surface of the outer structural layer with a chemical etchant system and forming an etched pattern in the outer structural layer thereby producing semiconductor devices having high resolution etched patterns.

2. The process of claim 1, wherein the resist lines and spaces therebetween have width dimensions of up to 2 microns.

3. The process of claim 1, wherein the resist lines and spaces therebetween have width dimensions of up to 1 micron.

4. The process of claim 1, wherein the resist lines and spaces therebetween have width dimensions of not more than 0.5 microns.

5. The process of claim 1, wherein the step of forming a negative photoresist etch mask on a major surface of the outer semiconductor device, which comprises:
   coating the major surface of the semiconductor device with a layer of a negative photosensitive resin;
   exposing said negative photosensitive resin to an optical image comprising a plurality of photoresist lines arranged in a predetermined pattern which defines a plurality of spaces therebetween, said exposed negative photosensitive resin producing an in situ catalyst at any sites contacted by the optical image;
   crosslinking the exposed negative photosenstive resin at the sites contacted by the optical image; and
   developing the crosslinked polymerized negative photosensitive resin with a photodeveloping agent to remove the non-crosslinked polymerized negative photosensitive resin and thereby forming said negative photoresist etch mask.

6. The process of claim 5, wherein the negative photosensitive resin comprises an acid-catalyzed photosensitive resin.

7. The process of claim 5, wherein the photodeveloping agent is a dilute hydroxide solution.

8. The process of claim 7, wherein the said dilute hydroxide solution is dilute tetramethyl ammonium hydroxide.

9. The process of claim 5, wherein the negative photosensitive resin comprises poly p-vinyl phenol resin.

10. The process of claim 6, wherein the acid-catalyzed photosensitive resin comprises a resin, an acid-activated crosslinking agent, and a photoacid generator.

11. A process for etching a semiconductor device to form a predetermined etched pattern therein, comprising:
   providing a semiconductor device having a plurality of structural layers, the structural layers of the semiconductor device being formed on an underlying silicon structural substrate;
   forming a said negative photoresist etch mask formation on a major surface of the outer semiconductor device, said negative photoresist etch mask comprising coating the major surface of the semiconductor device with a layer of a negative photosensitive resin, exposing said negative photosensitive resin to an optical image comprising a plurality of photoresist lines arranged in a predetermined pattern which defines a plurality of spaces therebetween, said exposed negative photosensitive resin producing an in situ catalyst at any sites contacted by the optical image, crosslinking the exposed negative photosensitive resin at the sites contacted by the optical image, developing the crosslinked polymerized negative photosenstive resin with a photodeveloping agent to remove the non-crosslinked polymerized negative photosensitive resin and thereby forming said negative photoresist etch mask without substantial residual resist material remaining in areas that should be free of resist material which would act as an impediment to the etching process; and
   selectively etching the plurality of exposed areas of the major surface of the outer structural layer with a chemical etchant system, and forming an etched pattern in the outer structural layer which produces semiconductor devices having high resolution etched patterns.

12. The process of claim 11, wherein the resist lines and spaces therebetween have width dimensions of up to 2 microns.

13. The process of claim 11, wherein the resist lines and spaces therebetween have width dimensions of up to 1 micron.

14. The process of claim 11, wherein the resist lines and spaces therebetween have width dimensions of not more than 0.5 microns.

15. The process of claim 11, wherein the negative photosensitive resin comprises an acid-catalyzed negative photosensitive resin.

16. The process of claim 15, wherein said acid-catalyzed negative photosensitive resin includes a resin, an acid-activated crosslinking agent, and a photoacid generator.

17. The process of claim 11, wherein the photodeveloping agent is a dilute hydroxide solution.

18. The process of claim 17, wherein the said dilute hydroxide solution is dilute tetramethyl ammonium hydroxide.

19. The process of claim 11, wherein the negative photosensitive resin comprises poly p-vinyl phenol resin.

20. The process of claim 16, wherein the acid-activated crosslinking agent comprises a melamine compound, and said photoacid generator comprises a material which releases an acid that promotes cross-linking of said melamine compound.

21. A process for etching a semiconductor device to form a predetermined etch pattern therein, comprising:
   providing a semiconductor device having a plurality of conductive film structural layer formed on an underlying silicon structural substrate, said semiconductor device having a re-entrant profile which causes residual positive photoresist material to remain therewithin after formation of an etch mask of said positive photoresist material;
   forming a negative photoresist etch mask on a major surface of the outer conductive film structural layer which comprises a plurality of photoresist lines arranged in a predetermined pattern which defines a plurality of spaces therebetween, said plurality of spaces exposing a plurality of areas of the major surface of the semiconductor device,
   the formation of said negative photoresist etch mask formation on a major surface of the outer semiconductor device comprising coating the major surface of the semiconductor device with a layer of a negative photosensitive resin, exposing said negative photosensitive resin to an optical image comprising a plurality of photoresist lines arranged in a predetermined pattern which defines a plurality of spaces therebetween, said exposed negative photosensitive resin producing an in situ catalyst at any sites contacted by the optical image, crosslinking the exposed negative photosensitive resin at the sites contacted by the optical image, and developing the crosslinked polymerized negative photosensitive resin with a photodeveloping agent to remove the non-crosslinked polymerized negative photosensitive resin and thereby forming said negative photoresist etch mask; and selectively etching the plurality of exposed areas of the major surface of the outer structural layer with a chemical etchant system, and forming an etched pattern in the outer structural layer which produces said semiconductor device having high resolution etched patterns.

22. The process of claim 21, wherein said semiconductor device comprises a stacked capacitor Dram memory device.

* * * * *